Sept. 1, 1959 V. M. HEAZEL, JR., ET AL 2,902,630

HERMETICALLY SEALED PACKAGE FOR ELECTRONIC COMPONENT

Filed May 3, 1956

INVENTORS
VINCENT M. HEAZEL, JR.
WILLIAM H. KUMM

BY R. I. Tompkins
ATTORNEYS 2,902,630

HERMETICALLY SEALED PACKAGE FOR ELECTRONIC COMPONENT

Vincent M. Heazel, Jr., Glen Burnie, and William H. Kumm, Baltimore, Md., assignors, by mesne assignments, to the United States of America as represented by the Secretary of the Navy Application May 3, 1956, Serial No. 582,611

4 Claims. (Cl. 317—101)

This invention relates to a hermetically sealed electronic unit suitable for use as a preamplifier for radar equipment, as a coupler for waveguide mixers, and an audio frequency control unit, or in analogous uses.

In present-day electronic apparatus, it has become important for many applications to reduce the volume and weight of the apparatus so that it may be readily mounted in restricted spaces such as that on aircraft. To forward this aim it has been proposed to provide sealed expendable units each adapted for plugging into a socket on a componentless chassis. However, a construction of this type has the disadvantage that for certain uses, such as for intermediate frequency amplification, an inordinate amount of filtering must be provided for each unit. In addition, the inputs and outputs of each unit must be heavily loaded so the interchangeability will not affect the intermediate frequency bandpass shape of the preamplifier because of unavoidable differences between production units. This means that the number of tubes in the pre-amplifier has to be increased to obtain the correct amount of gain.

In order to meet the above described difficulties, it is proposed to place all tubes and intermediate frequency coils on one side of the unit support plate and all filters on the other plate side, with intra-plate feedthrough impedances embedded in the plate between the plate side elements.

An important object of the invention, therefore, is to provide a sealed electronic unit in which the tubes and coils are on one side of a plate and the filtering unit on the other plate side with connecting impedances embedded in and extending through the plate.

An object, also, is to provide an electronic unit in which tubes and coils are on one side and filters on the other side of an intervening plate, with interconnecting sockets and the usual wiring eliminated. Another object is to provide feedthrough capacitive impedances for a unit plate-separator between tubes and filters which serve not only merely as feedthrough conductors but also as by-pass capacitors.

Other objects are to provide an electronic amplifying structural unit which markedly reduces space and weight in assemblies, as heretofore used, which makes possible an important reduction in the number of resistors, chokes, capacitors and amplification stages without reduction in overall gain and with improvement in noise figure, which permits close physical association with other units, such as waveguide mixer assemblies, and which is simpler in arrangement and cheaper in cost than prior similar purpose units.

Other objects and many of the attendant advantages of this invention will be readily appreciated as the same becomes better understood by reference to the following detailed description when considered in connection with the accompanying drawings wherein.

Figure 5:
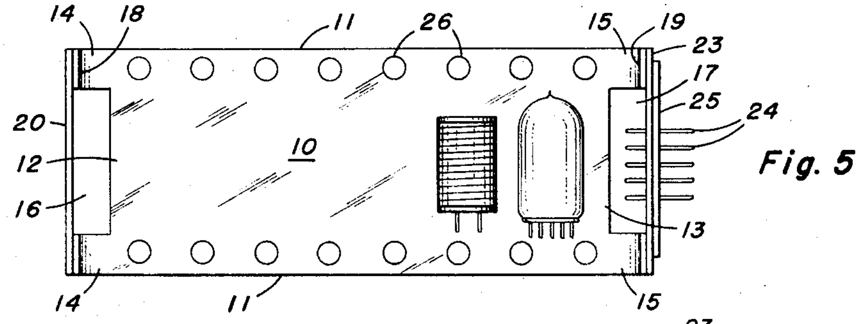
Fig. 5 is a plan view of the package with the casing removed to show the tube side of the partition plate.

The basic feature of the package is a flat partition plate 10 made of any material of adequate strength, this plate being elongated as shown in Fig. 5, with the side edges 11 straight and the end sections 12 and 13 having side projections 14 and 15, respectively, forming end pairs between which exist cut-away spaces 16 and 17. The end parts of projections 14 are upturned at right angles to the partition plate to form attachment areas 18 for the end sealing plate 20, this end plate extending above and below the partition plate to such extent as to define box limits permitting installation of tubes, coils, resistors and similar equipment for performance of the desired function of the package. This plate 20 may have sealed therein outlet terminal connections as indicated at 21 in Fig. 3; and screw or other connections may also be a part of its structure as indicated at 22 in Fig. 3.

The side projections 15 are also upturned at the end sections to provide attachment areas 19 for connection by any suitable means to end plate 23, which, similarly, extends above and below the partition plate 10, and may be provided with terminal pins 24 for electrical connection to associated electrical equipment. A reinforcing end plate 25 may be used to strengthen this plate 23, especially where the electrical connecting terminals are numerous, although this plate may coincide with the casing end plate as later described.

Figures 1, 2:
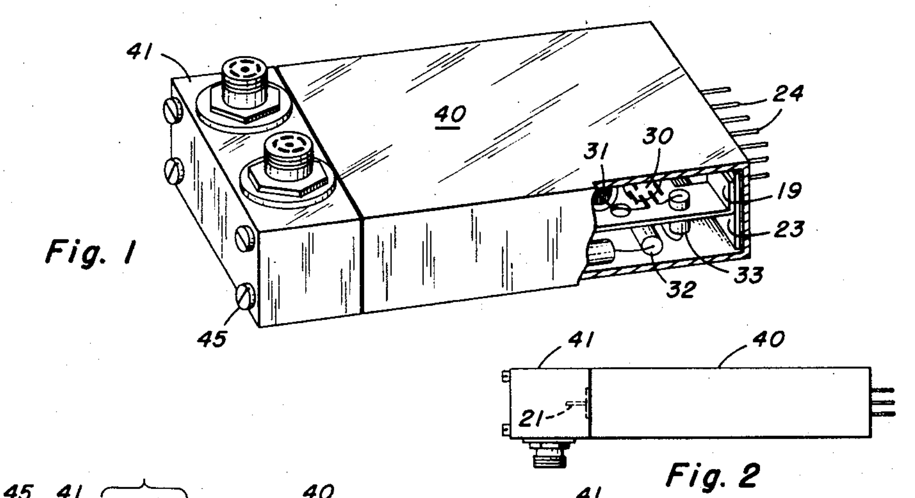
Fig. 1 is a view in perspective of the package with parts broken away to show the electrical elements and spacing plate.
Fig. 2 is a view of the package with one end plugged into a waveguide mixer connector.
Figure 6:
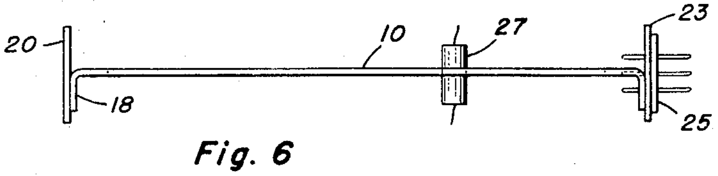
Fig. 6 is an edge view of the partition plate of the package showing an impedance element extending through, and attached to, the partition plate.

Plate 10 serves not only as a partition or separator between electrical elements of the package but also operates as a transitional agent between different types of electrical equipment, in that impedances transfix the plate at numerous points, being supported by the plate and serving, for example, as bypass capacitors or merely as feedthrough elements. Plate apertures for these impedances are indicated at 26 in Fig. 5, and a typical impedance is shown at 27, put in an aperture 26, in Fig. 6. The ends of each of these impedances 27 are on opposite sides of the plate 10 and on one plate side are attached to a battery of tubes or coils, preferably side mounted to conserve depth, and on the other plate side to filters, these connections being exampled by the tube 30, coil 31, filter element 32 and inter-connecting capacitor 33, as indicated in Fig. 1.

The partition plate 10, with the integral or attached end plates, are enclosed in a casing 40 which hermetically seals the unit, protecting it from dust and moisture and insuring it from physical disturbance of the component parts thereof.

Figure 3:
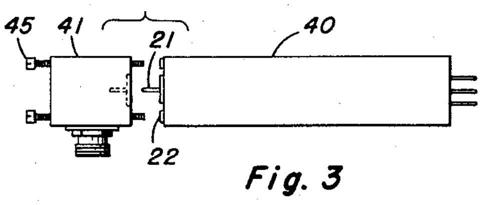
Fig. 3 is a view of the units of Fig. 2 with the mixer connector spaced from the package.
Figure 4:
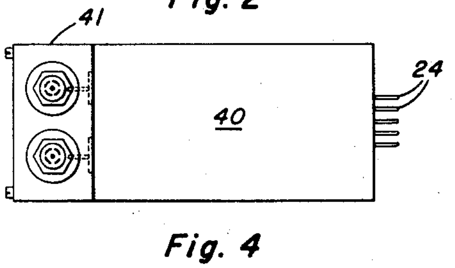
Fig. 4 is a plan view of the structure of Fig. 2.

As previously stated, the sealed package has capability of varied uses, the preferred uses being as a preamplifier for radar equipment where it is desirable that filtering be limited, the number of tubes reduced and in general, the bandpass shape between component units of the equipment be maintained without adverse distortion. For such uses, it has been found that more than one-third of the components, including resistors, chokes, capacitors and at least one complete stage of amplification can be eliminated with no reduction in overall gain and with an actual improvement in noise figure. No new circuits are involved, the arrangement merely permitting utilization of standard circuits at their maximum capabilities. Figs. 1, 2, 3 and 4 are illustrative of the mode of attachment to a related unit, such as a wave-guide mixer connector 41, Fig. 3 showing these components in dissassembly, in side elevation; Fig. 2 with the components united, in side elevation; Fig. 4 showing a plan view of the united components; and Fig. 1 showing the components in perspective with the external connector elements exposed. As indicated in Figs. 2, 3 and 4, the electrical connection between these components is made by the terminal connectors 21 while the physical connection is made by screws 45, fitting into cooperative screw elements 22. Any other appropriate mode of component connection may be made, provided, generally, as in the illustrated form, the adjoined units lie close to, and parallel with, each other.

It is pointed out that in the package construction, as described, the use of a partition plate in which impedances are transfixed permits group assembly of the signal components, tubes and coils in a line on one side of the plate and the filtering elements in a line on the other side, both lines being roughly parallel to the plate and thus permitting a compact structural form, irrespective of the electrical advantages of tube and filter reduction. It is noted, further, that the construction lends itself to extensive wiring reduction, the tube leads going directly to the coil terminals, feedthrough conductors or capacitors, thus reducing the stray capacitance and improving the figure of merit. Resistors and chokes are mounted point to point with very short leads. Also, where used as a pre-amplifier, the hermetic shield insures complete radio frequency shielding from input to output.

Obviously many modifications and variations of the present invention are possible in the light of the above teachings. It is therefore to be understood that within the scope of the appended claims the invention may be practiced otherwise than as specifically described.

What is claimed is:

1. A hermetically sealed package containing electrical devices for pre-amplifiers and the like comprising an elongated plate having side and end edges provided with a series of openings therethrough; a plurality of electrical impedances supported in said openings and extending therethrough with ends on opposite sides of said plate; a plurality of tube and coil elements on one side of said plate between the protruding ends of said impedances and having direct connection to the impedance ends on said one side of the plate; a plurality of filters on the other side of said plate having direct connection to the impedance ends on said other side of the plate; a hermetically sealed casing enclosing said plate, tubes, coils, impedances, filters and connections therebetween; and outlet terminals passing through said casing for forming connection between said package electrical devices and external circuit units.

2. The hermetically sealed package containing electrical devices for pre-amplifiers and the like as defined in claim 1, said impedances being in the form of capacitors.

3. A hermetically sealed package containing electrical devices for pre-amplifiers and the like comprising a rigid elongated plate having side and end edges and apertures formed adjacent said side edges at spaced points, impedances positioned within said apertures attached to said plate with opposite impedance terminals being on opposite plate sides, a battery of one type of electrical elements on one side of said plate connected to the adjacent ends of said impedances, a battery of a second type of electrical elements on the other side of said plate connected to the adjacent ends of said impedances, a casing hermetically sealing said plate, impedances and electrical elements, and outlet terminals connected to said elements and extending through said casing for outside connections.

4. The hermetically sealed package containing electrical devices for pre-amplifiers and the like as defined in claim 3, said impedances being capacitors, said one type of electrical elements including electron tubes, and said second type of electrical elements consisting of filters only.

References Cited in the file of this patent

UNITED STATES PATENTS

| | | |
|---|---|---|
| 2,417,420 | Knapp | Mar. 18, 1947 |
| 2,439,411 | Mitchell | Apr. 13, 1948 |
| 2,440,308 | Storck | Apr. 27, 1948 |
| 2,495,546 | Posen | Jan. 24, 1950 |
| 2,641,635 | Scal | June 9, 1953 |
| 2,682,018 | Phillips | June 22, 1954 |
| 2,764,713 | Alden | Sept. 25, 1956 |